(12) United States Patent
Ajoian

(10) Patent No.: US 9,085,826 B2
(45) Date of Patent: Jul. 21, 2015

(54) METHOD OF FABRICATING PRINTED CIRCUIT BOARD (PCB) SUBSTRATE HAVING A CAVITY

(71) Applicant: Avago Technologies General IP (Singapore) Pte. Ltd., Singapore (SG)

(72) Inventor: Jack Ajoian, Campbell, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 133 days.

(21) Appl. No.: 14/039,784

(22) Filed: Sep. 27, 2013

(65) Prior Publication Data

US 2015/0090688 A1  Apr. 2, 2015

(51) Int. Cl.
*C23F 1/02* (2006.01)

(52) U.S. Cl.
CPC .......................... *C23F 1/02* (2013.01)

(58) Field of Classification Search
USPC ................ 216/13, 41, 59, 65, 83; 219/121.19
See application file for complete search history.

(56) References Cited

U.S. PATENT DOCUMENTS

| 5,161,093 A * | 11/1992 | Gorczyca et al. ............. 361/795 |
| 8,432,022 B1 | 4/2013 | Huemoeller et al. |
| 2007/0099339 A1 * | 5/2007 | Chang ............................ 438/106 |
| 2008/0148563 A1 * | 6/2008 | Sakamoto et al. .............. 29/852 |
| 2012/0129298 A1 * | 5/2012 | Lin et al. ....................... 438/118 |
| 2012/0248585 A1 | 10/2012 | Wu |

OTHER PUBLICATIONS

Hirokazu Toyoda, "In-House Manufacture of the "Laminate" High-Density Multilayer Build-up Interposer Substrate", Side View, Dec. 2008, pp. 1-4.

* cited by examiner

*Primary Examiner* — Shamim Ahmed

(57) ABSTRACT

A method is provided for fabricating a substrate having multiple metal layers separated by one or more dielectric layers, respectively. The method includes forming a cavity in at least one dielectric layer through an exposed portion of a top dielectric layer of the substrate, applying metal to side and bottom surfaces of the cavity, forming a pattern through a portion of the metal applied to the bottom surface of the cavity, and micro-etching the metal applied to the bottom surface of the cavity. The micro-etching extends the pattern through a remaining portion of the metal applied to the bottom surface of the cavity.

20 Claims, 7 Drawing Sheets

METHOD OF FABRICATING PRINTED CIRCUIT BOARD (PCB) SUBSTRATE HAVING A CAVITY

BACKGROUND

Thinner and more capable consumer electronic products generally require functionally higher density packaging. As device footprints and thicknesses are reduced, advanced packaging approaches are required to address the high density challenge of fitting the same (or increased) circuitry and/or functionality into smaller volumes.

On technique for reducing device size and increasing capability involves adding more metal layers (routing layers) in the substrate. However, additional metal layers result in thinner dielectric layers separating the metal layers, components and/or overmold. Accordingly, there is a need for improved component integration and assembly, particularly when substrate thickness of the consumer electronic products can no longer be challenged.

BRIEF DESCRIPTION OF THE DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. Where technical features in the figures, detailed description or any claim are followed by references signs, the reference signs have been included for the sole purpose of increasing the intelligibility of the figures, detailed description, and/or claims. Accordingly, neither the reference signs nor their absence are intended to have any limiting effect on the scope of any claim elements. In the figures, each identical or nearly identical component that is illustrated in various figures is represented by a like numeral. For purposes of clarity, not every component may be labeled in every figure. In the figures:

DETAILED DESCRIPTION

Figure 1:
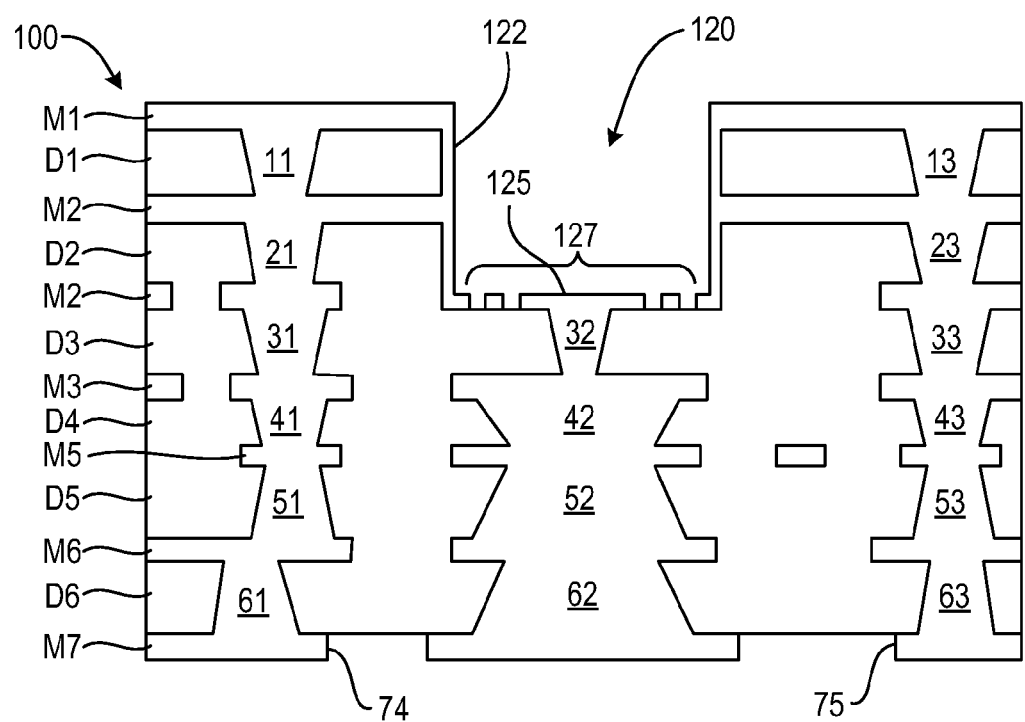
FIG. 1 is a cross-sectional view of a printed circuit board (PCB) substrate defining a cavity, according to a representative embodiment.

In the following detailed description, for purposes of explanation and not limitation, specific details are set forth in order to provide a thorough understanding of illustrative embodiments according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the illustrative embodiments. Such methods and apparatuses are clearly within the scope of the present teachings.

Representative embodiments are generally directed to methods of fabricating a cavity in a printed circuit board (PCB) that exposes the PCB circuitry for a package, such as flip-chip or die-attach assembly of semi-conductors, for example. The cavity has metal plated (e.g., copper plated) side and bottom surfaces, which may provide electromagnetic interference (EMI) shielding from adjacent circuitry and a more robust electrical design solution. In addition, the construction of the cavity enables reduced thermal resistance to the bottom interface. Also, placement of components (e.g., dies) within the cavity reduces overmold thickness, and thus overall package thickness. The reduced overmold thickness also reduces overmold-induced stresses that may otherwise reduce die interconnect reliability and/or cause package warpage, particularly with thin PCB substrates, for example.

It is to be appreciated that embodiments of the methods and apparatuses discussed herein are not limited in application to the details of construction and the arrangement of components set forth in the following description or illustrated in the accompanying figures. The methods and apparatuses are capable of implementation in other embodiments and of being practiced or of being carried out in various ways. Examples of specific implementations are provided herein for illustrative purposes only and are not intended to be limiting. In particular, acts, elements and features discussed in connection with any one or more embodiments are not intended to be excluded from a similar role in any other embodiments. Like reference numerals in the figures refer to like elements.

Also, the phraseology and terminology used herein is for the purpose of description and should not be regarded as limiting. Any references to embodiments or elements or acts of the systems and methods herein referred to in the singular may also embrace embodiments including a plurality of these elements, and any references in plural to any embodiment or element or act herein may also embrace embodiments including only a single element. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, and upper and lower are intended for convenience of description, not to limit the present systems and methods or their components to any one positional or spatial orientation. The terms "a" or "an", as used herein are defined as one or more than one. The term "plurality" as used herein is defined as two or more than two.

As used in the specification and appended claims, and in addition to their ordinary meanings, the terms "substantial" or "substantially" mean to with acceptable limits or degree. Also, as used in the specification and the appended claims and in addition to its ordinary meaning, the terms "about" and "approximately" mean to within an acceptable limit or amount to one having ordinary skill in the art. For example, "approximately the same" means that one of ordinary skill in the art would consider the items being compared to be the same.

In a representative embodiment, a method is provided for fabricating a substrate having a multiple metal layers separated by one or more dielectric layers. The method includes forming a cavity in at least one dielectric layer through an exposed portion of a top dielectric layer of the substrate, applying metal to side and bottom surfaces of the cavity, forming a pattern through a portion of the metal applied to the bottom surface of the cavity, and micro-etching the metal applied to the bottom surface of the cavity. The micro-etching extends the pattern through a remaining portion of the metal applied to the bottom surface of the cavity.

In another representative embodiment, a method is provided for fabricating a substrate. The method includes forming multiple metal layers separated by one or more dielectric layers, a top metal layer of the multiple metal layers defining a first opening that exposes a portion of a top dielectric layer of the dielectric layers; applying a photoresist pattern over the top metal layer, the photoresist pattern defining a second opening over the first opening in the top metal layer; ablating the top dielectric layer using a first laser through the first and second openings to form a cavity through at least the top dielectric layer; plating metal to side and bottom surfaces of the cavity; ablating the plated metal on the bottom surface of the cavity using a second laser to form a pattern through a portion of the plated metal on the bottom surface of the cavity; and micro-etching the plated metal on the bottom surface of the cavity to extend the pattern through a remaining portion of the plated metal applied to the bottom surface of the cavity.

FIG. 1 is a cross-sectional view of an example of a printed circuit board (PCB) substrate used for semiconductor packaging, according to a representative embodiment. In the depicted example, the PCB substrate is a build-up substrate in which a cavity is formed, according to fabrication processes described below, where various features, such as lines, spaces, vias, and the like, may be incorporated on the bottom metal layer of the cavity.

Referring to FIG. 1, illustrative PCB substrate 100 includes seven metal layers, indicated as first through seventh metal layers M1 to M7. The first through seventh metal layers M1 to M7 are generally separated by intervening first through sixth dielectric layers D1 to D6, respectively. Of course, design requirements provide for various interconnections between adjacent metal layers and adjacent dielectric layers, as would be apparent to one skilled the art. Thus, various illustrative features are shown interconnecting adjacent metal layers from among the first through seventh metal layers M1 to M7 and adjacent dielectric layers from among the first through sixth dielectric layers D1 to D6. For example, representative vias 11, 13 connect the first and second metal layers M1 and M2 through the first dielectric layer D1; representative vias 21, 23 connect the second and third metal layers M2 and M3 through the second dielectric layer D2; representative vias 31, 32, 33 connect the third and fourth metal layers M3 and M4 through the third dielectric layer D3; representative vias 41, 42, 43 connect the fourth and fifth metal layers M4 and M5 through the fourth dielectric layer D4; representative vias 51, 52, 53 connect the fifth and sixth metal layers M5 and M6 through the fifth dielectric layer D5; and representative vias 61, 62, 63 connect the sixth and seventh metal layers M6 and M7 through the sixth dielectric layer D6.

The first through seventh metal layers M1 to M7 may be formed of various metal materials (or other electrically conductive materials), such as copper, aluminum, gold, platinum, tungsten or molybdenum, for example, or combinations thereof. The first through sixth dielectric layers D1 to D6 may be formed of various dielectric materials, such as glass and non-glass reinforced epoxy materials (e.g., glass reinforced FR-4), and glass and non-glass reinforced polymer materials. Of course, other metal (or electrically conductive) materials and dielectric materials may be incorporated without departing from the scope of the present teachings.

The PCB substrate 100 also includes cavity 120 formed through a top surface (e.g., first metal layer M1). The cavity 120 is defined by side surfaces 122 and bottom surface 125, to which metal, such as copper, is applied. The metal may be applied to the side and bottom surfaces 122 and 125 of the cavity 120 in accordance with a metal plating operation, for example. The metal plated side surfaces 122 and/or the bottom surface 125 of the cavity 120 may provide EMI shielding from adjacent circuitry.

In the depicted example, the cavity 120 extends to the third metal layer M3, meaning that the bottom surface 125 of the cavity 120 substantially coincides with the third metal layer M3. However, the thickness of the bottom surface 125 will vary with application of metal plating and subsequent micro-etching process, described below. The bottom surface 125 also includes an etch pattern to accommodate circuitry of the PCB substrate 100. Of course, in alternative configurations, the cavity 120 may extend to metal layers higher or lower than the third metal layer M3 without departing from the scope of the present teachings.

Figure 2:
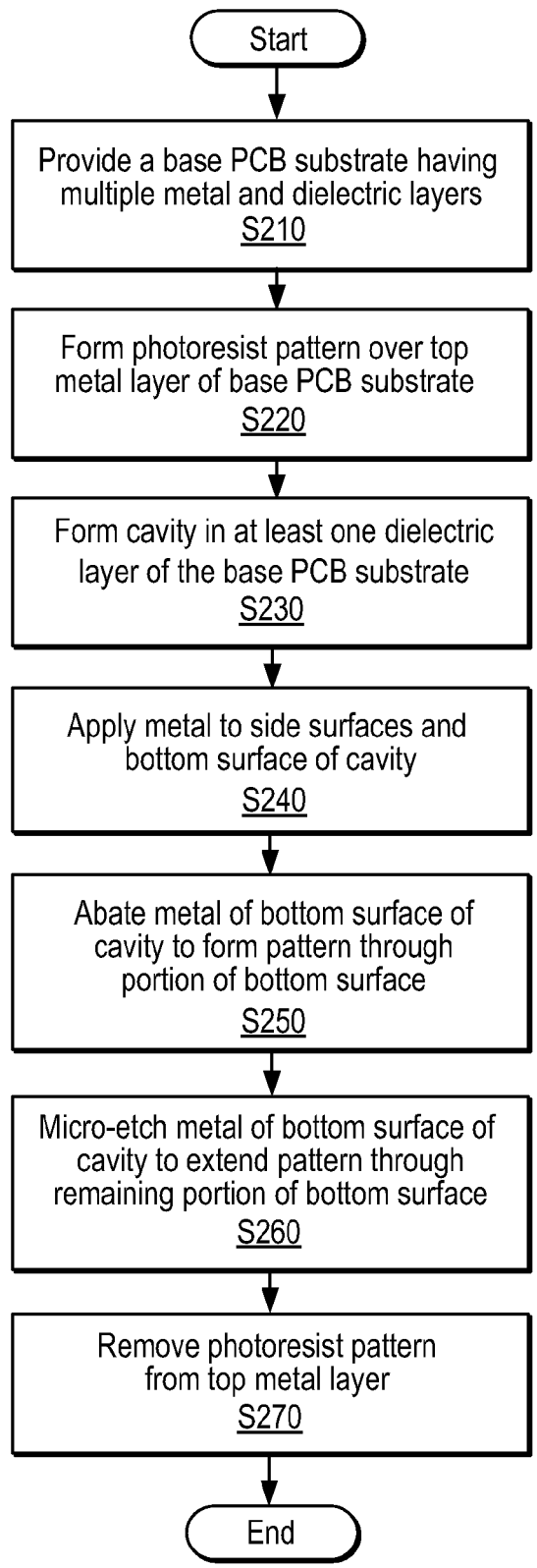
FIG. 2 is a flow diagram showing a method of fabricating a PCB substrate defining a cavity, according to a representative embodiment.

FIG. 2 is a flow diagram showing a method of fabricating a PCB substrate having a cavity, according to a representative embodiment, where the PCB substrate comprises multiple metal layers generally separated by multiple dielectric layers.

Referring to FIG. 2, a base PCB substrate, which has no cavity yet (e.g., such as cavity 120 shown in FIG. 1), is provided in block S210. For example, the base PCB substrate may be provided by forming multiple metal layers (e.g., first through seventh metal layers M1 to M7) and multiple dielectric layers (e.g., first through sixth dielectric layers D1 to D6) between the multiple metal layers, respectively. The layers may be created by applying approximately 2 to 3 µm foil (seed layer) (e.g., Cu), for example, and laminating the foil with a dielectric (prepreg) layer. This process is known as Modified Semi-Additive Process (MSAP), according to which a pattern is created by a dry-film and the pattern is plated up. After the pattern is formed, the dry film is removed and the foil may be etched away. Alternatively, the layers may be created by a subtractive process, in which an approximately 18 µm foil, for example, is laminated with each dielectric layer, the pattern is created by a dry film (e.g., photolithography) and exposed metal will be etched away until the pattern is formed. Of course, any other compatible layer formation technique may be incorporated without departing from the scope of the present teachings.

The base PCB substrate may also include various features for forming a desired circuit, such as lines, vias interconnecting metal layers, and through-holes interconnecting dielectric layers. In an embodiment, the base PCB substrate includes a top metal layer of the multiple metal layers which defines a first opening. The first opening exposes a portion of a top dielectric layer of the multiple dielectric layers in the base PCB substrate.

In block S220, a photoresist pattern is formed over the top metal layer of the base PCB substrate. The photoresist pattern defines a second opening over (and substantially coinciding with) the first opening in the top metal layer, thus exposing the exposed portion of the top dielectric layer. The photoresist pattern may be formed by applying a photoresist layer, such as a dry film layer, to the top surface of the top metal layer, and patterning the photoresist layer to form the photoresist pattern (mask), using any compatible photoresist patterning technique, as would be apparent to one skilled in the art. For example, the photoresist pattern may be formed by chemically etching (or micro-machining) the photoresist layer using photolithography, although various alternative techniques may be incorporated.

In block S230, a cavity is formed in at least one dielectric layer through the exposed portion of the top dielectric layer of the base PCB substrate. For example, the top dielectric layer may be ablated using a first laser through the first opening in the top metal layer and the second opening in the photoresist pattern to form the cavity. Depending on the desired depth of the cavity (e.g., to the third metal layer M3, as shown in FIG. 1), the laser ablation may continue through one or more additional dielectric layers consecutively arranged beneath the top dielectric layer. The first laser may be a carbon dioxide ($CO_2$) laser, for example, although other types of lasers may be incorporated without departing from the scope of the present teachings.

Metal is applied to the side surfaces and the bottom surface of the cavity in block S240. The metal may be copper, although various other types of metal (or other electrically conductive materials), such as aluminum, gold, platinum, tungsten or molybdenum, or combinations thereof may be used without departing from the scope of the present teachings. In an embodiment, the metal is applied to the side and bottom surfaces of the cavity using a metal plating operation, thus providing metal plated surfaces. The process for applying the metal plating may include insertion into a plating vat, where an electroless seed layer is first applied, and then the metal is electroplated to the seed layer. In various alternative configurations, if a via is not provided in the cavity area of the metal layer forming the bottom of the cavity (such as via 32 in the depicted example), the metal layer forming the bottom of the cavity (e.g., metal layer M3) may be left as a seed layer during the layer formation process, and subsequently plated when applying metal to the side and bottom surfaces of the cavity. The seed layer will be protected from patterning, plating, and etching during the metal layer development step. This reduces a total thickness of the exposed copper area in the cavity, enabling more efficient drilling and pattern resolution in the following steps.

In block S250, the (plated) metal on the bottom surface of the cavity is ablated using a second laser to form a predetermined pattern. The pattern is formed through only a portion of the metal on the bottom surface of the cavity. In other words, the ablation is discontinued before the pattern extends through the entire thickness of the bottom metal surface of the cavity, leaving a thinner layer of metal at the bottom of the patterned areas. For example, the laser ablation by the second laser may continue until the pattern extends through a majority (more that 50 percent) of the thickness of the bottom metal surface of the cavity. Or, for example, the laser ablation by the second laser may continue until the pattern extends through about 75 percent of the thickness of the bottom metal surface of the cavity. The second laser may be an ultraviolet (UV) laser, for example, which tends to be more efficient and accurate for metals than other lasers, such as a $CO_2$ laser. In general, $CO_2$ lasers are more efficient than UV lasers at ablating dielectric materials, such as glass, and UV lasers are better than $CO_2$ lasers at ablating metals. However, other types of lasers may be incorporated without departing from the scope of the present teachings. In various embodiments, the first and second lasers may be a single laser (e.g., a UV laser), configured to perform the functions of both. Also, the first and second lasers may be tunable lasers. Generally, laser patterning is utilized in block S250, as opposed less accurate patterning techniques for cavities, such as dry film etching, for example, because dry film cannot be reliably applied (e.g., laid flat) to the bottom metal surface of the cavity, or liquid photo imageable resist, for example, which pools in the cavity and provides poor resolution when defined.

The metal on the bottom surface of the cavity is then micro-etched in block S260 in order to extend the pattern through a remaining portion of the metal applied to the bottom surface of the cavity. The micro-etching may be performed using a wet chemistry, for example, such sodium per sulfate or hydrogen peroxide with sulfuric acid, although other micro-etching techniques may be incorporated without departing from the scope of the present teachings. Accordingly, the remaining thickness of the bottom metal surface of the cavity within the pattern is removed by the micro-etching. The micro-etching process also incidentally etches the metal applied to the side metal surfaces and bottom metal surface (outside the pattern) of the cavity as well, making the metal slightly thinner, but still fully covering the corresponding side and bottom metal surfaces outside the pattern.

The photoresist pattern applied in block S220 may be removed in block S270 following the micro-etching process. Typical metal finish plating and coatings may be applied once the cavity and circuitry are formed, as would be apparent to one skilled in the art. Thus, a finished PCB substrate is provided, such as PCB substrate 100 shown in FIG. 1, for example. The cavity in the PCB substrate, and more particularly the predetermined pattern on the bottom metal surface of the cavity, is configured to expose PCB circuitry, e.g., for flip-chip or die-attach assemblies of a semiconductor, enabling reduced thermal resistance and reducing overmold thickness, as well as reducing overall package thickness.

FIG. 3A through 3K are cross-sectional views of a PCB having a cavity corresponding to fabrication steps, according to a representative embodiment. More particularly, FIGS. 3A to 3G are cross-sectional views depicting fabrication steps for forming the base PCB substrate (before formation of a cavity), e.g., discussed above with reference to block S210 of FIG. 2, and FIGS. 3H to 3K are cross-sectional views depicting fabrication steps for forming the PCB substrate cavity and the predetermined pattern on the bottom of the cavity, discussed above with reference to blocks S220 to S270 of FIG. 2.

Figure 3A:
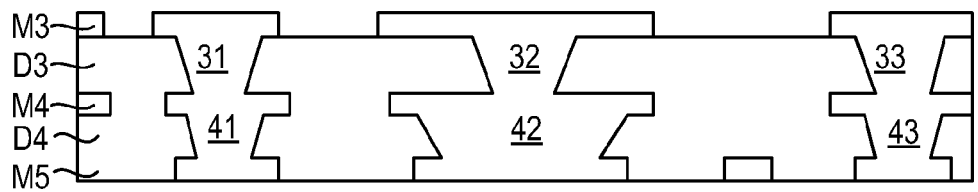
FIG. 3A through 3K are cross-sectional views of a PCB defining a cavity corresponding to fabrication steps, according to a representative embodiment.

FIG. 3A shows an initial stack of the base PCB including third, fourth and fifth metal layers M3, M4 and M5, separated by third and fourth dielectric layers D3 and D4, respectively, following a de-carrier procedure by which the initial stack is removed from the carrier. The fifth metal layer M5 effectively acts as a seed layer. As shown, it is assumed for purposes of illustration that vias have already been formed, including vias 31, 32 and 33 connecting the third and fourth metal layers M3 and M4, and vias 41, 42 and 43 connecting the fourth and fifth metal layers M4 and M5.

Figure 3B:
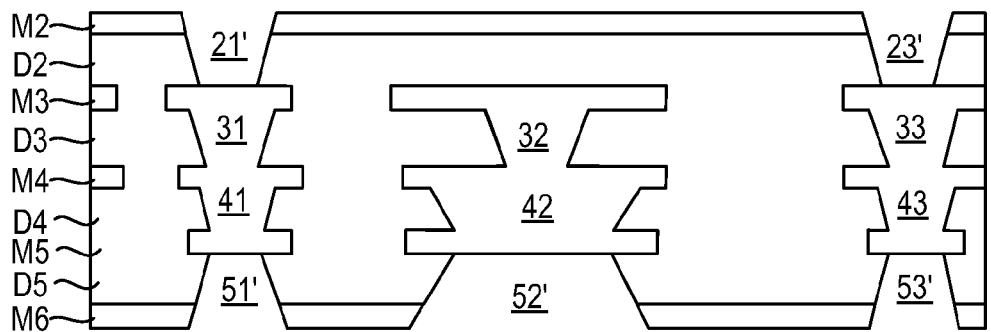

FIG. 3B shows a lamination process, by which second dielectric layer D2 and second metal layer M2 are sequentially added to a top surface of the third metal layer M3, and fifth dielectric layer D5 and sixth metal layer M6 are sequentially added to a bottom surface of the fifth metal layer M5. Under various circumstances, other techniques may be used to add the dielectric and metal layers, such as spin-on, sputtering, evaporation, physical vapor deposition (PVD) and/or chemical vapor disposition (CVD) techniques, as would be apparent to one skilled in the art. Holes 21' and 23' are laser drilled through the second metal layer M2 and second dielectric layer D2, and holes 51', 52' and 53' are laser drilled through the sixth metal layer M6 and the fifth dielectric layer D5. The holes 21', 23', 51', 52' and 53' may be drilled using a $CO_2$ laser, for example, although other types of lasers or other techniques for forming holes, such as mechanical and chemical etching techniques, may be incorporated without departing from the scope of the present teachings. For example, according to alternative techniques, vias may be plated up first and then the dielectric material is laminated into the via field. In this process, the metal will then be sputtered onto each layer.

Figure 3C:
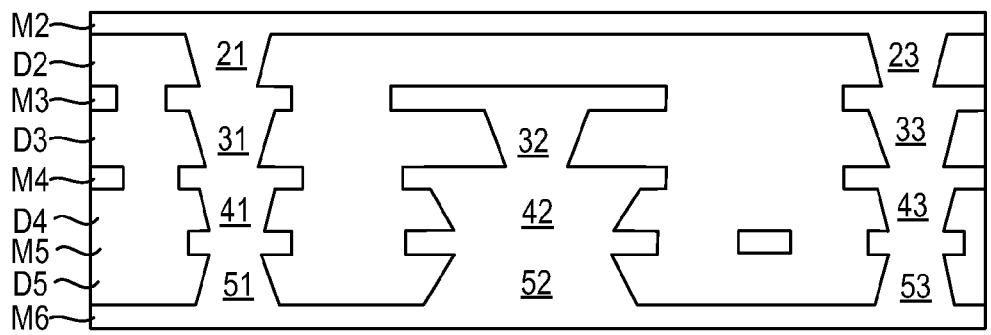

FIG. 3C shows formation of vias in the drilled holes. That is, metal material is applied to form vias 21 and 23 by filling holes 21' and 23', respectively, and to form vias 51, 52 and 53 by filling holes 51', 52' and 53', respectively. The applied metal may be the same metal forming the second through sixth metal layers M2 to M6, for example. Also, a planarization process may follow to provide a substantially planar top surface of the second metal layer M2 and a substantially planar bottom surface of the sixth metal layer M6.

Figure 3D:
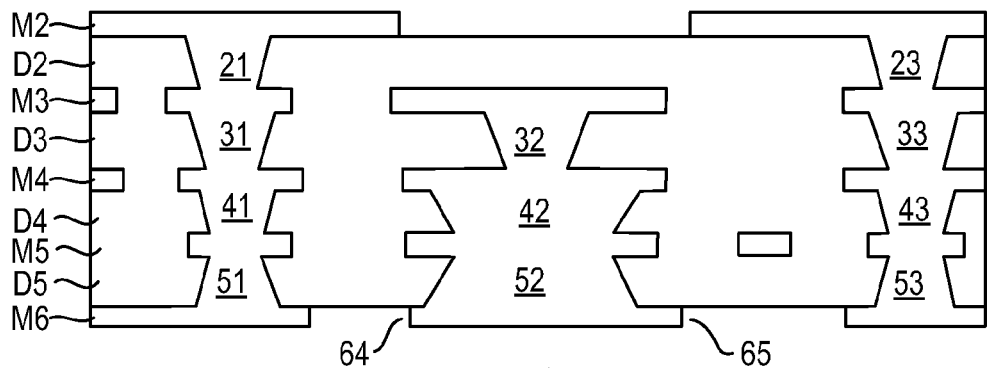

Pattern plates, such as photoresist patterns (not shown), are added to the top surface of the second metal layer M2 and to the bottom surface of the sixth metal layer M6, respectively. As shown in FIG. 3D, etching is then performed to remove a portion of the second metal layer M2 using the top pattern plate as a mask to form opening 24 in the second metal layer M2, and to remove portions of the sixth metal layer M6 using the bottom pattern plate as a mask to form openings 64 and 65 in the sixth metal layer M6. The opening 24 exposes a portion of the second dielectric layer D2, and the openings 64 and 65 expose corresponding portions of the fifth dielectric layer D5. Various compatible etching techniques may be used, including wet etch processes, such as hydrofluoric acid (HF) etching, or dry etch processes, such as Bosch etching, for example.

Figure 3E:
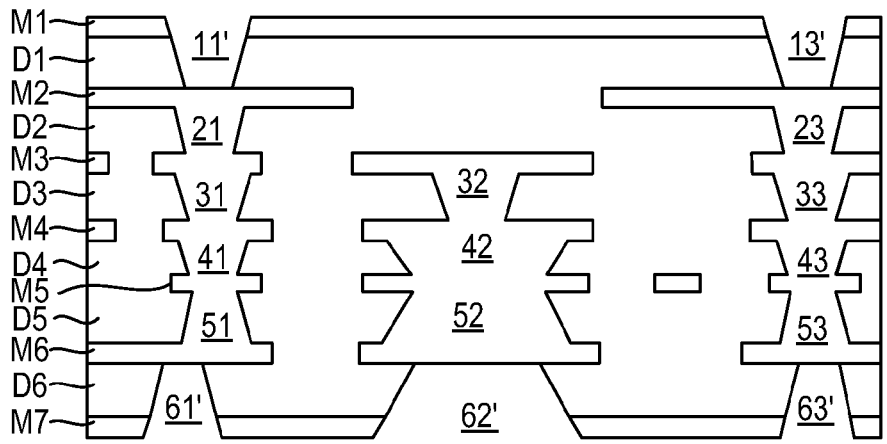

FIG. 3E shows another lamination process, by which first dielectric layer D1 and first metal layer M1 are sequentially added to a top surface of the second metal layer M2, and sixth dielectric layer D6 and seventh metal layer M7 are sequentially added to a bottom surface of the sixth metal layer M6. Holes 11' and 13' are laser drilled through the first metal layer M1 and first dielectric layer D1, and holes 61', 62' and 63' are laser drilled through the seventh metal layer M7 and the sixth dielectric layer D6. The holes 11', 13', 61', 62' and 63' may be drilled using a $CO_2$ laser, for example, although other types of lasers or other techniques for forming holes, such as mechanical and chemical etching techniques, may be incorporated without departing from the scope of the present teachings.

Figure 3F:
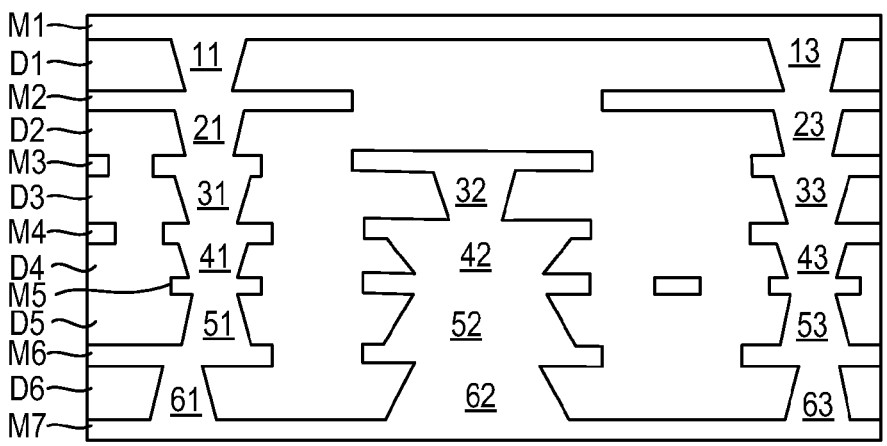

FIG. 3F shows formation of vias in the drilled holes. That is, metal material is applied to form vias 11 and 13 by filling holes 11' and 13', respectively, and to form vias 61, 62 and 63 by filling holes 61', 62' and 63', respectively. The applied metal may be the same metal forming the first through seventh metal layers M1 to M7, for example. Also, a planarization process may follow to provide a substantially planar top surface of the first metal layer M1 and a substantially planar bottom surface of the seventh metal layer M7.

Figure 3G:
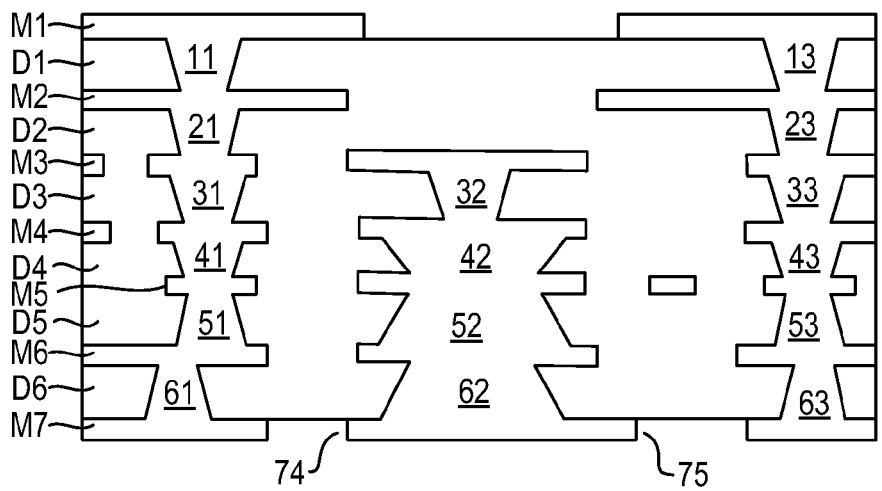

Pattern plates, such as photoresist patterns (not shown), are added to the top surface of the first metal layer M1 and to the bottom surface of the seventh metal layer M7, respectively. As shown in FIG. 3G, etching is then performed to remove a portion of the first metal layer M1 using the top pattern plate as a mask to form opening 14 in the first metal layer M1, and to remove portions of the seventh metal layer M7 using the bottom pattern plate as a mask to form openings 74 and 75 in the seventh metal layer M7. The opening 24 exposes a portion of the first dielectric layer D1, and the openings 74 and 75 expose corresponding portions of the sixth dielectric layer D6. Various compatible etching techniques may be used, including wet etch processes, such as HF etching, or dry etch processes, such as Bosch etching, for example. FIG. 3G thus shows the completed base PCB substrate, discussed above with reference to block S210 of FIG. 2.

FIGS. 3H to 3K are cross-sectional views depicting formation of the cavity and predetermined pattern in the bottom surface of the cavity, e.g., discussed above with reference to blocks S220 to S270 of FIG. 2.

Figure 3H:
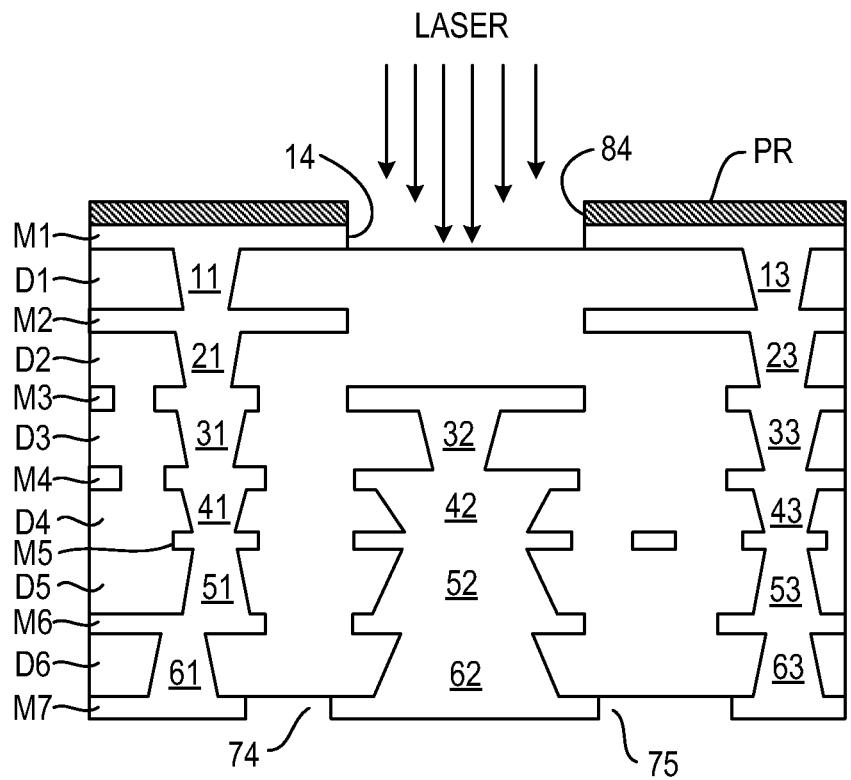

FIG. 3H shows application of a photoresist pattern PR over the first metal layer M1 of the base PCB substrate. The photoresist pattern PR defines an opening 84 that substantially coincides with the opening 14 in the first metal layer M1, which exposes a portion of the top surface of the first dielectric layer D1. As discussed above, the photoresist pattern PR may be formed by applying a photoresist layer, such as a dry film layer, to the top surface of the first metal layer M1, and patterning the photoresist layer to form the photoresist pattern PR using any compatible photoresist patterning technique. For example, the photoresist pattern PR may be formed by machining or by chemically etching the photoresist layer using photolithography, although various alternative techniques may be incorporated.

FIG. 3H further shows applying laser energy to the photoresist pattern, directed to the opening 84, in order to ablate the first dielectric layer D1 to begin formation of a cavity (e.g., cavity 120, discussed below). The laser energy may be applied by a first laser, such as a $CO_2$ laser, for example, although other types of lasers may be incorporated without departing from the scope of the present teachings. In the depicted example, the laser ablation continues through the first and second dielectric layers D1 and D2, ending upon reaching the top surface of the third metal layer M3. The resulting cavity 120, shown in FIG. 3I, has side surfaces 122 and a bottom surface 125 (e.g., an exposed portion of the third metal layer M3). The laser energy is directional, and in the depicted example is applied substantially perpendicular to the photoresist pattern PR (and the first metal layer M1), so that the side surfaces 122 of the cavity 120 may be substantially parallel to one another and substantially perpendicular to the first metal layer M1. Further, the laser energy is applied substantially evenly across the opening 84, so that the bottom surface 125 of the cavity 120 is substantially planar. In various configurations, the cavity 120 may be slightly wider at the top than at the bottom, e.g., due to different exposure times between the top and bottom of the cavity 120, in addition to laser diffraction, resulting in a taper to the side surfaces 122.

Figure 3I:
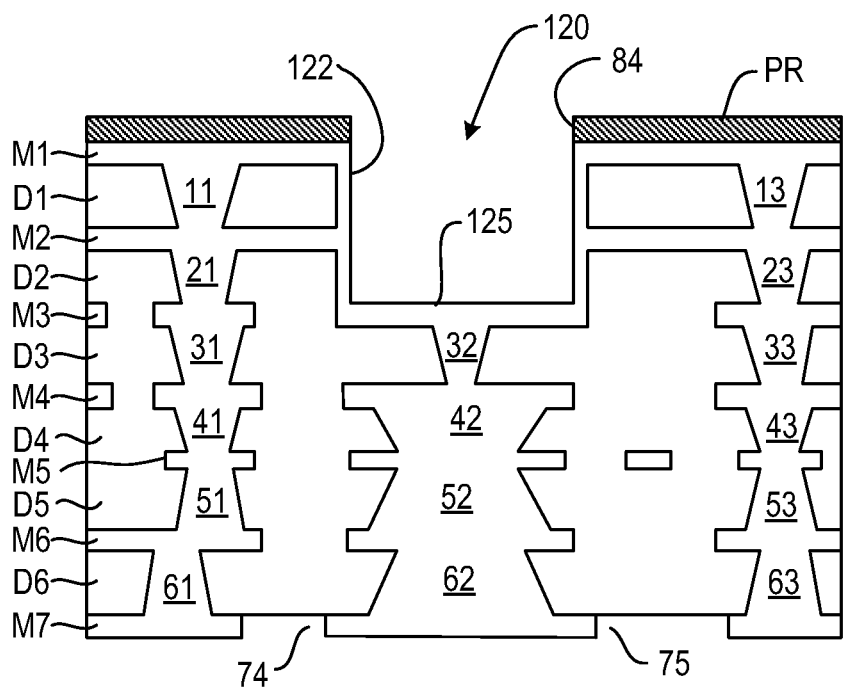

Also shown in FIG. 3I, metal is applied to the side surfaces 122 and the bottom surface 125 of the cavity 120, which may include a metal plating operation. The metal plating may be performed by introducing the PCB substrate into a plating vat, for example. An initial application may provide an electroless seed layer and a subsequent application may electroplate the metal to the seed layer on the side and bottom surfaces 122 and 125. As mentioned above, the metal may be copper, in which case the metal plating would comprise copper plating, although other metals and/or plating techniques may be incorporated without departing from the scope of the present teachings.

Figure 3J:
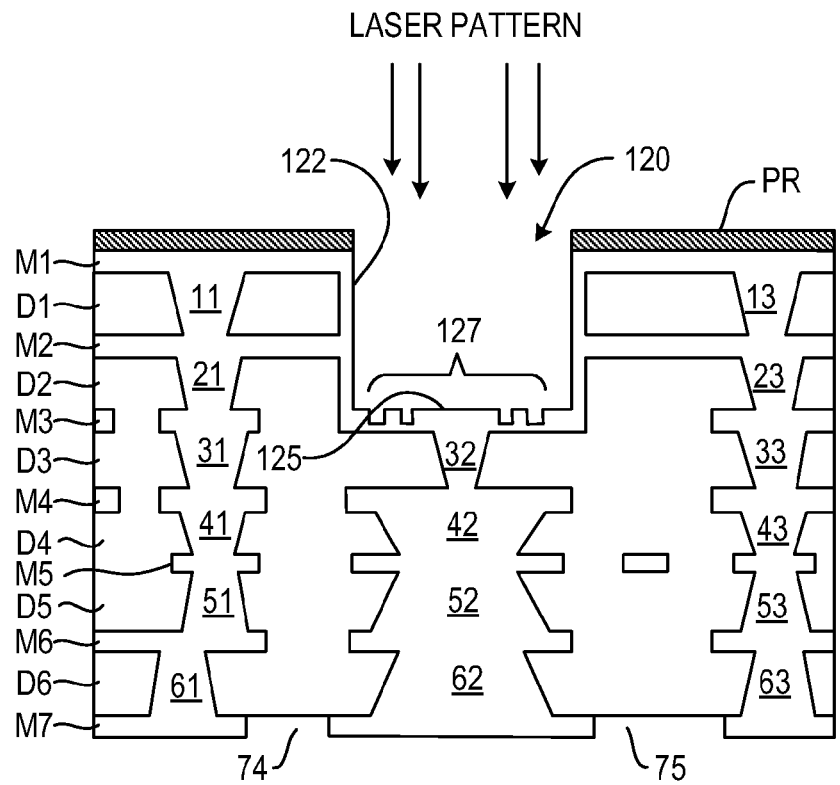

FIG. 3J shows applying laser energy directed to the bottom surface 125 of the cavity 120 in order to form a predetermined pattern 127 partially through the bottom surface 125. That is, the bottom surface 125 is laser ablated to form the predetermined pattern to a controlled depth. As stated above, the controlled depth of the ablated pattern 127 may be through a majority of the thickness of the bottom surface 125, although various respective depths may be used. Notably, the thickness of the bottom surface 125 would be the combined thicknesses of the third metal layer M3 and the metal plating. The laser energy may be applied by a second laser, such as a UV laser, for example, although other types of lasers may be incorporated without departing from the scope of the present teachings.

Figure 3K:
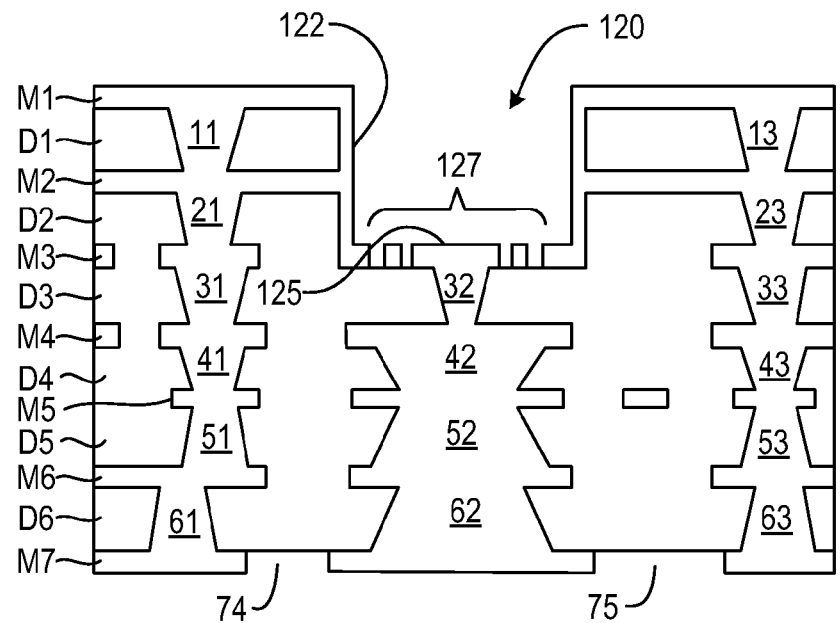

FIG. 3K shows performing a micro-etching process that etches the metal remaining in the bottom of the pattern in the bottom surface 125 of the cavity 120, thereby extending the pattern through the remaining portion of bottom surface 125 (the remaining depth). The micro-etching may be performed using a wet chemistry, for example, such as sodium per sulfate or hydrogen peroxide with sulfuric acid, although other micro-etching techniques may be incorporated without departing from the scope of the present teachings. In this manner, the patterning of the bottom surface 125 within the cavity 120 may be precisely controlled, for example, without the need for a dry mask, which would be difficult to arrange in a sufficiently precise manner inside the cavity 120. The micro-etching may also thin the other metal plated on the side and bottom surfaces 122 and 125, although the metal plating would retain sufficient thickness to provide structural integrity of the side and bottom surfaces 122 and 125, and to provide EMI shielding with respect to surrounding circuits. The end result shown in FIG. 3K provides the illustrative PCB substrate 100 discussed above with reference to FIG. 1.

Figure 4A:
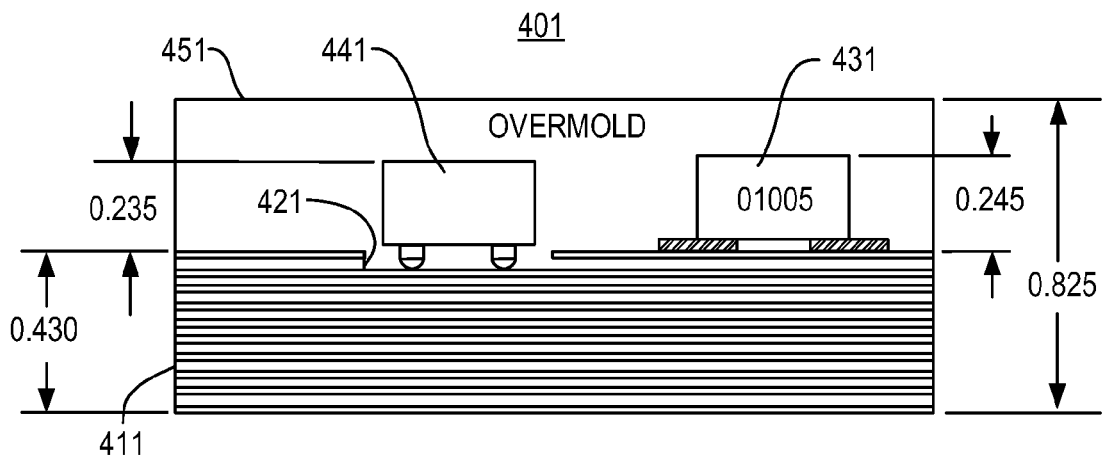
FIGS. 4A through 4C are cross-sectional views of different configurations of a single die package, including a PCB substrate, according to representative embodiments.
Figure 4B:
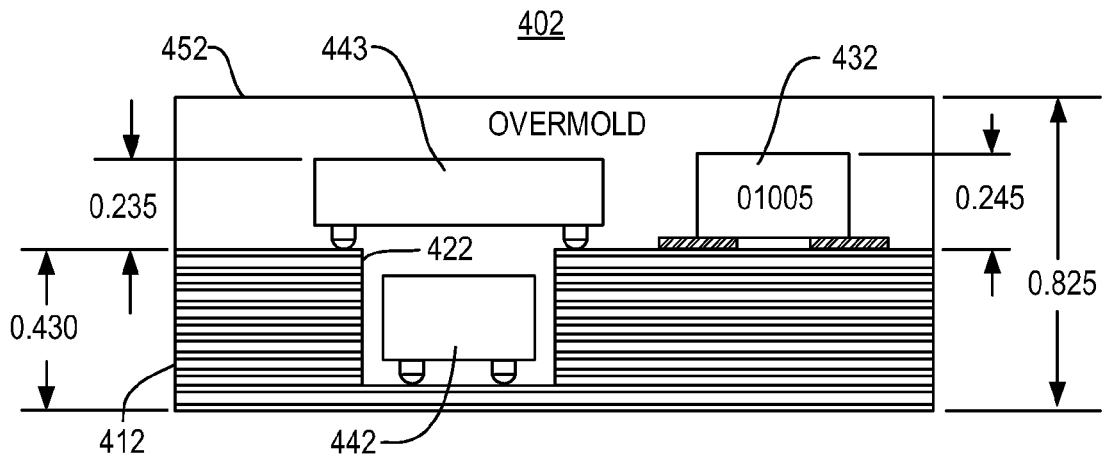
Figure 4C:
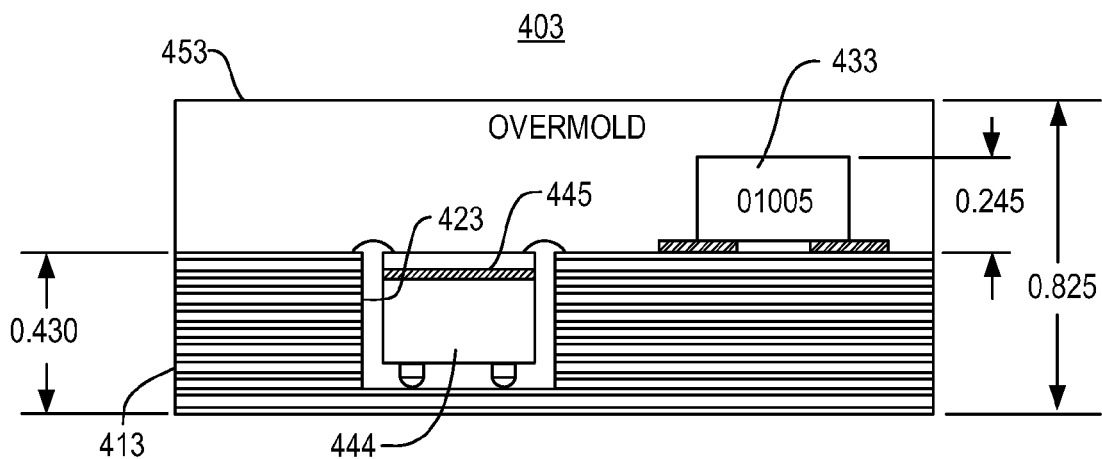

The various embodiments provide higher density packaging. For example, the various embodiments enable higher density packaging when two dies exist in the same footprint, while being interconnected to two separate PCB routing layers (metal layers). FIGS. 4A through 4C are cross-sectional views diagrams of various illustrative configurations of a single die package, including the PCB substrate, according to representative embodiments.

FIG. 4A is a cross-sectional view of single chip package 401 having a PCB substrate 411 with a cavity 421, according to a representative embodiment, which enables a surface mounted component 431, such as thick film chip resistor 01005, to dictate the limiting height factor. The chip package 401 includes a die 441 positioned in the relatively shallow cavity 421, and overmold 451 encapsulating the surface mounted component 431 and the die 441. In the depicted example, the height of the PCB substrate 411 is 0.430 mm; the height of the surface mounted component 431 from the top surface of the PCB substrate 411 is 0.245 mm; the height of the die 441 from the top surface of the PCB substrate 411 is 0.235 mm; and the overall height of the chip package 401 including the overmold 451 is 0.825 mm. Of course, the embodiments are not limited to these illustrative dimensions.

FIG. 4B is a cross-sectional view of single chip package 402 having a PCB substrate 412 with a cavity 422, according to a representative embodiment, which again enables a surface mounted component 432, such as thick film chip resistor 01005, to dictate the limiting height factor. The chip package 402 includes two flip-chip assembled stacked dies 442 and 443. Overmold 452 encapsulates the surface mounted component 431, and the stacked dies 442 and 443. The die 442 is positioned in the cavity 422, and the die 443 is surface mounted over the cavity 422. Each of the stacked dies 442 and 443 interface independent routing layers of the PCB substrate 412 (where the surface mounted die 443 interfaces the top routing layer). In the depicted example, the height of the PCB substrate 412 is 0.430 mm; the height of the surface mounted component 432 from the top surface of the PCB substrate 412 is 0.245 mm; the height of the die 443 from the top surface of the PCB substrate 412 is 0.235 mm; and the overall height of the chip package 402 including the overmold 452 is 0.825 mm. Of course, the embodiments are not limited to these illustrative dimensions.

FIG. 4C is a cross-sectional view of single chip package 403 having a PCB substrate 413 with a cavity 423, according to a representative embodiment, which again enables a surface mounted component 433, such as thick film chip resistor 01005, to dictate the limiting height factor. The chip package 403 includes a stack die having one flip-chip assembled die 444 and one wire-bonded die 445. Overmold 453 encapsulates the surface mounted component 431, and the stacked dies 444 and 445. The dies 444 and 445 are both positioned in the cavity 423. Each of the dies 444 and 445 interface independent routing layers of the PCB substrate 413 (where the wire-bonded die 445 interfaces the top routing layer). In the depicted example, the height of the PCB substrate 413 is 0.430 mm; the height of the surface mounted component 433 from the top surface of the PCB substrate 413 is 0.245 mm; and the overall height of the chip package 403 including the overmold 453 is 0.825 mm. Of course, the embodiments are not limited to these illustrative dimensions.

The PCB substrate and fabrication processes according to various representative embodiments may provide significant improvements over conventional PCB substrates and fabrication processes, including providing EMI shielded cavities and accurate pattern creation in already formed cavities. Having thus described several aspects of at least a representative embodiment, it is to be appreciated various alterations, modifications, and improvements will readily occur to those skilled in the art. Such alterations, modifications, and improvements are intended to be part of this disclosure and are intended to be within the scope of the invention. Accordingly, the foregoing description and drawings are by way of example only, and the scope of the invention should be determined from proper construction of the appended claims, and their equivalents.

The invention claimed is:

1. A method of fabricating a substrate having a plurality of metal layers separated by one or more dielectric layers, the method comprising:
    forming a cavity in at least one dielectric layer through an exposed portion of a top dielectric layer of the substrate;
    applying metal to side and bottom surfaces of the cavity;
    forming a pattern through a portion of the metal applied to the bottom surface of the cavity; and
    micro-etching the metal applied to the bottom surface of the cavity, the micro-etching extending the pattern through a remaining portion of the metal applied to the bottom surface of the cavity.

2. The method of claim 1, wherein applying the metal to the side and bottom surfaces of the cavity comprises performing a metal plating operation.

3. The method of claim 2, wherein the metal applied to the side and bottom surfaces of the cavity is configured to provide EMI shield from adjacent circuitry.

4. The method of claim 1, further comprising:
    applying a photoresist pattern over a top metal layer of the plurality of metal layers before applying the metal to the side and bottom surfaces of the cavity, the photoresist pattern defining an opening over the exposed portion of the top dielectric layer; and
    removing the photoresist pattern after micro-etching the bottom surface of the cavity.

5. The method of claim 1, wherein the metal layers and the metal applied to the side and bottom surfaces of the cavity are formed of copper.

6. The method of claim 5, wherein the dielectric layers are formed of glass reinforced epoxy material.

7. The method of claim 6, wherein the glass reinforced epoxy material comprises FR-4 material.

8. The method of claim 5, wherein the dielectric layers are formed of non-glass reinforced epoxy material.

9. The method of claim 5, wherein the dielectric layers are formed of glass reinforced polymer material.

10. The method of claim 5, wherein the dielectric layers are formed of non-glass reinforced polymer material.

11. The method of claim 1, wherein the cavity is formed in the at least one dielectric layer using laser ablation.

12. The method of claim 11, wherein the laser ablation is performed by a $CO_2$ laser.

13. The method of claim 1, wherein the pattern is formed through the portion of the metal applied to the bottom surface of the cavity using laser ablation.

14. The method of claim 13, wherein the laser ablation is performed by a UV laser.

15. The method of claim 1, wherein the cavity is configured to expose PCB circuitry for flip-chip or die-attach assembly of a semiconductor, enabling reduced thermal resistance and reducing overmold thickness.

16. A method of fabricating a substrate, comprising:
forming a plurality of metal layers separated by one or more dielectric layers, a top metal layer of the plurality of metal layers defining a first opening that exposes a portion of a top dielectric layer of the plurality of dielectric layers;
applying a photoresist pattern over the top metal layer, the photoresist pattern defining a second opening over the first opening in the top metal layer;
ablating the top dielectric layer using a first laser through the first and second openings to form a cavity through at least the top dielectric layer;
plating metal to side and bottom surfaces of the cavity;
ablating the plated metal on the bottom surface of the cavity using a second laser to form a pattern through a portion of the plated metal on the bottom surface of the cavity; and
micro-etching the plated metal on the bottom surface of the cavity to extend the pattern through a remaining portion of the plated metal applied to the bottom surface of the cavity.

17. The method of claim 16, wherein the first laser is a $CO_2$ laser and the second laser is a UV laser.

18. The method of claim 16, wherein the portion of the plated metal on the bottom surface of the cavity through which the pattern is formed is a majority of a thickness of the plated metal on the bottom surface.

19. The method of claim 16, wherein the micro-etching is performed using a wet chemistry.

20. The method of claim 16, wherein the metal plated to the side and bottom surfaces of the cavity is configured to provide EMI shield from adjacent circuitry.

* * * * *